(12) United States Patent
Kato et al.

(10) Patent No.: US 8,643,026 B2
(45) Date of Patent: Feb. 4, 2014

(54) SEMICONDUCTOR MODULE

(75) Inventors: Masahiro Kato, Tokyo (JP); Shinya Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 219 days.

(21) Appl. No.: 13/298,711

(22) Filed: Nov. 17, 2011

(65) Prior Publication Data

US 2012/0206196 A1      Aug. 16, 2012

(30) Foreign Application Priority Data

Feb. 14, 2011   (JP) ................................ 2011-028184

(51) Int. Cl.
*H01L 29/15*   (2006.01)
(52) U.S. Cl.
USPC ........................................... 257/77; 257/480
(58) Field of Classification Search
USPC .................................................. 257/77, 480
See application file for complete search history.

(56) References Cited

U.S. PATENT DOCUMENTS

| 5,661,644 | A | 8/1997 | Bergman et al. |
| 6,291,880 | B1 | 9/2001 | Ogawa et al. |
| 2006/0232253 | A1* | 10/2006 | Salato et al. ................... 323/225 |
| 2010/0019279 | A1* | 1/2010 | Chen et al. ..................... 257/194 |
| 2011/0101336 | A1* | 5/2011 | Yamazaki ........................ 257/43 |

FOREIGN PATENT DOCUMENTS

| JP | 10-93015 | 4/1998 |
| JP | 11-233712 | 8/1999 |
| JP | 11-510000 | 8/1999 |
| JP | 2000-138343 | 5/2000 |
| JP | 2003-18862 | 1/2003 |
| JP | 2003-219687 | 7/2003 |
| JP | 2004-047883 | 2/2004 |
| JP | 2006-149195 | 6/2006 |
| JP | 2009-272482 | 11/2009 |

OTHER PUBLICATIONS

Office Action mailed Oct. 29, 2013 in Japanese Application No. 2011-028184 filed Feb. 14, 2011 (w/partial English translation).

* cited by examiner

*Primary Examiner* — Douglas Menz
(74) *Attorney, Agent, or Firm* — Oblon, Spivak, McClelland, Maier & Neustadt, L.L.P.

(57) ABSTRACT

A PFC module includes: a diode bridge having first and second diodes in the upper arm, and third and fourth diodes in the lower arm; and first and second switching elements for power factor correction. The first and second diodes are Schottky barrier diodes formed by using a wide bandgap semiconductor. The third and fourth diodes, and the first and second switching elements are diodes and switching elements respectively formed by using silicon.

5 Claims, 5 Drawing Sheets

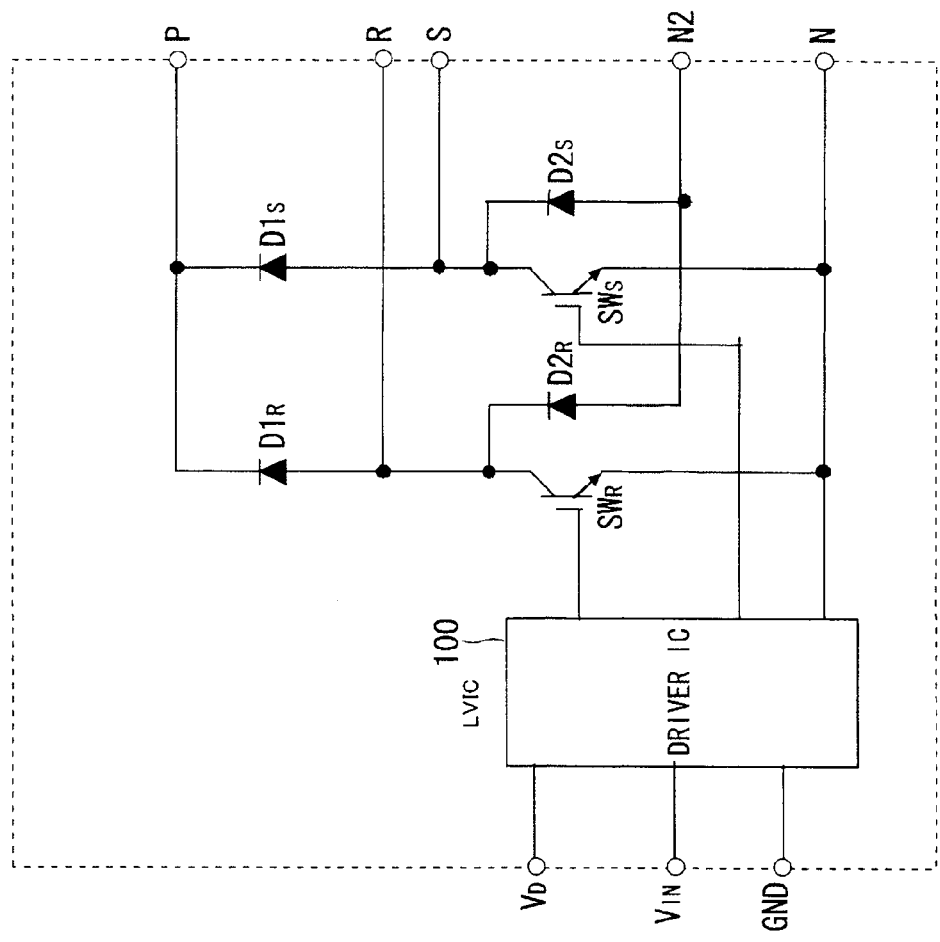
F I G. 1

SEMICONDUCTOR MODULE

BACKGROUND OF THE INVENTION

1. Field of the Invention

The present invention relates to the structure of a semiconductor module with a power factor correction (PFC) circuit.

2. Description of the Background Art

Use of a PiN (p-intrinsic-n) diode formed by using silicon (Si) in a semiconductor module for power control (power module) conventionally produces the storage effect of minority carriers to generate a recovery current. This is one of factors for loss increase of the power module. Such loss is reduced significantly by a Schottky barrier diode. So, in many cases, a Schottky barrier diode (SBD) formed by using Si is used in the conventional power module.

A semiconductor element using a wide bandgap semiconductor is regarded as a promising element to function as a next-generation switching element capable of realizing high breakdown voltage, low loss, and high resistance to heat. Patent literatures 1 to 5 listed below each disclose an example in which a semiconductor device formed by using silicon carbide (SiC) (SiC device) that is a typical wide bandgap semiconductor is applied in a power module.

Patent Literature 1: Japanese Patent Application Laid-Open No. 10-93015 (1998)

Patent Literature 2: Japanese Patent Application Laid-Open No. 11-233712 (1999)

Patent Literature 3: Japanese Patent Application Laid-Open No. 11-510000 (1999)

Patent Literature 4: Japanese Patent Application Laid-Open No. 2003-18862

Patent Literature 5: Japanese Patent Application Laid-Open No. 2006-149195

A PFC module including a rectifying diode bridge and a power factor correction (PFC) circuit is known as one of power modules with diodes. A diode bridge of a conventional PFC module is constructed of Schottky barrier diodes made of Si. Meanwhile, voltage drop in a forward direction (forward voltage (VF)) of the Schottky barrier diode made of Si increases considerably if a breakdown voltage is several hundred volts or higher. So, if used in a power module for high-voltage control, the Schottky barrier diode made of Si may increase loss of the power module more seriously than a PiN diode.

In contrast, a Schottky barrier diode formed by using SiC makes it possible to maintain a forward voltage at a low level even if a breakdown voltage is several hundred volts or higher. So, a power module with low loss and excellent recovery characteristics is achieved by applying a Schottky barrier diode made of SiC in the power module. However, an SiC device entails higher cost than an Si device. So, manufacturing cost is increased if a power module is formed as an SiC device.

SUMMARY OF THE INVENTION

It is an object of the present invention to provide a low-loss and low-cost PFC module with excellent recovery characteristics.

A semiconductor module of the present invention includes a diode bridge having first and second diodes with cathodes connected to each other, and third and fourth diodes with anodes connected to each other. The first and third diodes are connected in series, and the second and fourth diodes are connected in series. A first switching element is connected to a connection node between the first and third diodes. The second switching element is connected to a connection node between the second and fourth diodes. The first and second diodes are Schottky barrier diodes formed by using a wide bandgap semiconductor. The third and fourth diodes, and the first and second switching elements are diodes and switching elements respectively formed by using silicon.

The first and second diodes in the upper arm of the diode bridge function not only as rectifying elements but also as free-wheeling diodes while the first and second switching elements are in operation for PFC. To be specific, the first and second switching elements operate at high frequencies during PFC control, so recovery loss generated during the free-wheeling operation of the first and second diodes contributes largely to the loss of the entire PFC module. The first and second diodes formed as SiC devices with low loss and excellent recovery characteristics allow significant reduction of the loss of the PFC module. Further, not all the power chips but only the first and second diodes are formed as SiC devices, so that cost increase is suppressed. Also, the characteristics of the low-loss SiC devices that allow size reduction contribute to the size reduction of the PFC module.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram of a PFC module of the present invention;

EMBODIMENT FOR CARRYING OUT THE INVENTION

First Preferred Embodiment

FIG. 1 is a circuit diagram of a PFC module as a semiconductor module of the present invention. As shown in FIG. 1, the PFC module includes a diode bridge with the first to fourth diodes $D1_R$, $D1_S$, $D2_R$ and $D2_S$, first and second switching elements $SW_R$ and $SW_S$ for power factor correction, and a driver IC 100 for controlling the first and second switching elements $SW_R$ and $SW_S$.

The diode bridge is constructed of the first and second diodes $D1_R$ and $D1_S$ in the upper arm with cathodes connected to each other, and the third and fourth diodes $D2_R$ and $D2_S$ in the lower arm with anodes connected to each other. The first and third diodes $D1_R$ and $D2_R$ are connected in series, and the second and fourth diodes $D1_S$ and $D2_S$ are connected in series. A terminal R connecting the anode of the first diode $D1_R$ and the cathode of the third diode $D2_R$, and a terminal S connecting the anode of the second diode $D1_S$ and the cathode of the fourth diode $D2_S$ function as input terminals from which AC power is supplied.

A terminal P connecting the cathodes of the first and second diodes $D1_R$ and $D1_S$ is an output terminal of a higher potential side. The first switching element $SW_R$ is placed between a connection node (terminal R) between the first and third diodes $D1_R$ and $D2_R$, and a terminal N as an output terminal of a lower potential side. The second switching element $SW_S$ is placed between a connection node (terminal S) between the second and fourth diodes $D1_S$ and $D2_S$, and the terminal N.

An external control IC (not shown) is connected to a terminal N2 connecting the anodes of the third and fourth diodes $D2_R$ and $D2_S$. The control IC supplies a control signal to a terminal VIN of the driver IC 100 in response to a signal of the terminal N2 to control the first and second switching elements $SW_R$ and $SW_S$, thereby making the first and second switching elements $SW_R$ and $SW_S$ perform a predetermined operation for power factor correction. In FIG. 1, a terminal $V_D$ is a power supply terminal of the driver IC 100, and a terminal GND is a ground terminal.

Figure 2:
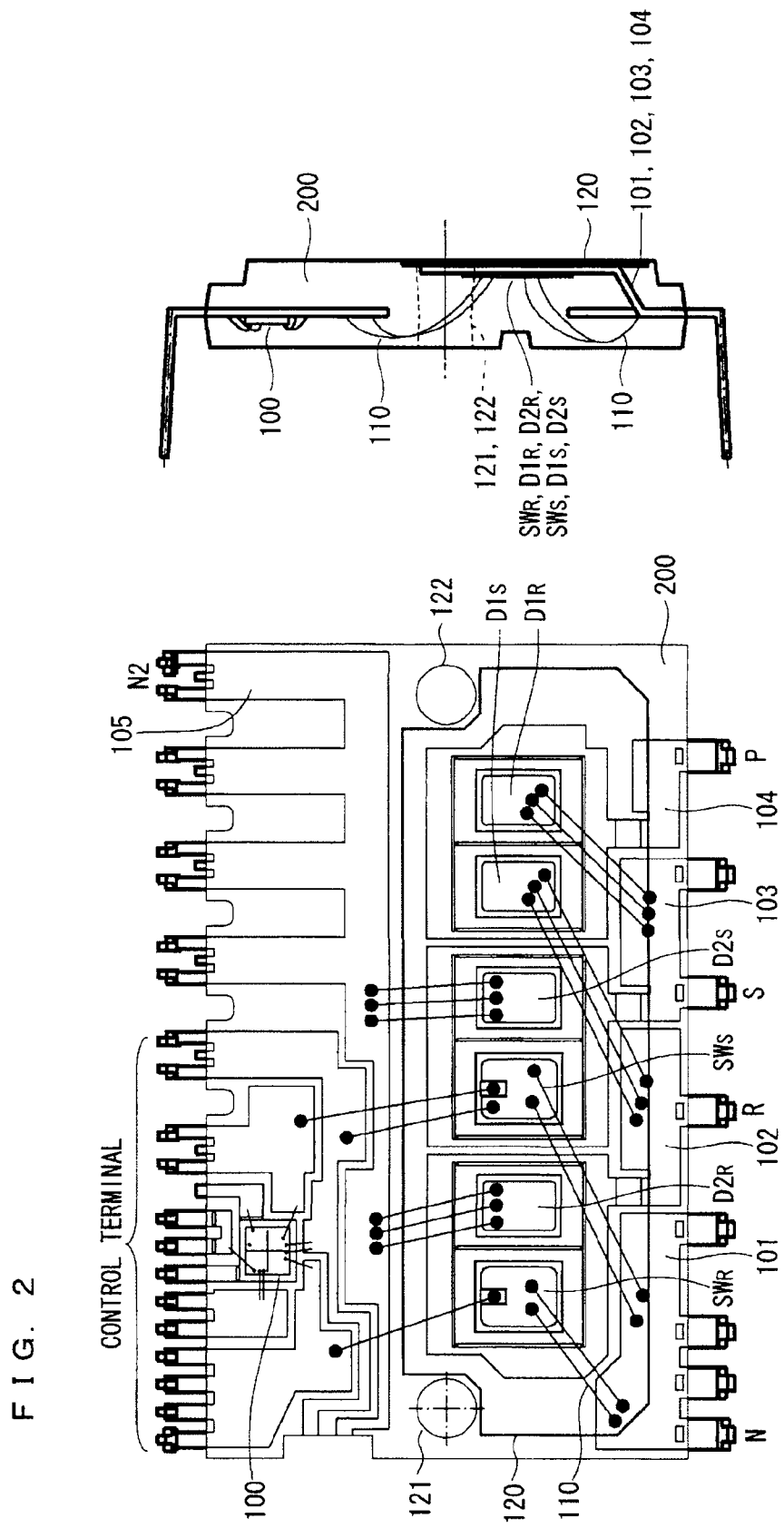
FIG. 2 shows the structure of a conventional PFC module.

The structure of a conventional PFC module is described next that is given as a Comparative Example of the present invention. FIG. 2 includes a plan view and a sectional view showing the structure of the conventional PFC module. The conventional PFC module includes first to fourth diodes $D1_R$, $D1_S$, $D2_R$ and $D2_S$ that are Schottky barrier diodes made of Si, and first and second switching elements $SW_R$ and $SW_S$ that are for example IGBTs formed by using Si. As the first to fourth diodes $D1_R$, $D1_S$, $D2_R$ and $D2_S$, PiN diodes are used if a breakdown voltage is several hundred volts or higher and Schottky barrier diodes are used if a breakdown voltage is several hundred volts or lower, as described above. That is, the first to fourth diodes $D1_R$, $D1_S$, $D2_R$ and $D2_S$, and the first and second switching elements $SW_R$ and $SW_S$ are all Si devices.

In the PFC module shown in FIG. 2, chips of the first and second diodes $D1_R$ and $D1_S$ are placed on a lead frame 104 (first lead frame) functioning as a terminal P. Chips of the third diode $D2_R$ and the first switching element $SW_R$ are placed on a lead frame 102 (second lead frame) functioning as a terminal R. Further, chips of the fourth diode $D2_S$ and the second switching element $SW_S$ are placed on a lead frame 103 (third lead frame) functioning as a terminal S. A driver IC 100 is placed on a certain lead frame functioning as control terminals (terminals VIN, VD, GND and the like) used to control the driver IC 100.

In FIG. 2, the lead frames 101 and 105 function as terminals N and N2 respectively. Further, the chips and the lead frames are connected to each other through wire lines 110.

The aforementioned constituent elements are held with a molding resin forming a casing 200 of the PFC module. The lead frames 101 to 104 project in part as external connection terminals from one side surface of the casing 200. The lead frame 105 projects from a different side surface of the casing 200 together with the control terminals (terminals VIN, VD, GND and the like) of the driver IC 100. The PFC module of FIG. 2 is provided with through holes 121 and 122 for attachment that penetrate through the casing 200.

As shown in the sectional view on the right side of FIG. 2, in the conventional PFC module, the lead frames 101 to 104 are bent downward inside the casing 200, and parts of the lower surfaces of the lead frames 101 to 104 at which the lead frames 101 to 104 hold the chips placed thereon are exposed at the bottom surface of the casing 200. An insulating sheet 120 of high heat conductivity is affixed to the exposed parts of the lead frames 101 to 104. This structure makes it possible to dissipate heat easily from the first to fourth diodes $D1_R$, $D1_S$, $D2_R$ and $D2_S$, and the first and second switching elements $SW_R$ and $SW_S$ to outside.

Figure 3:
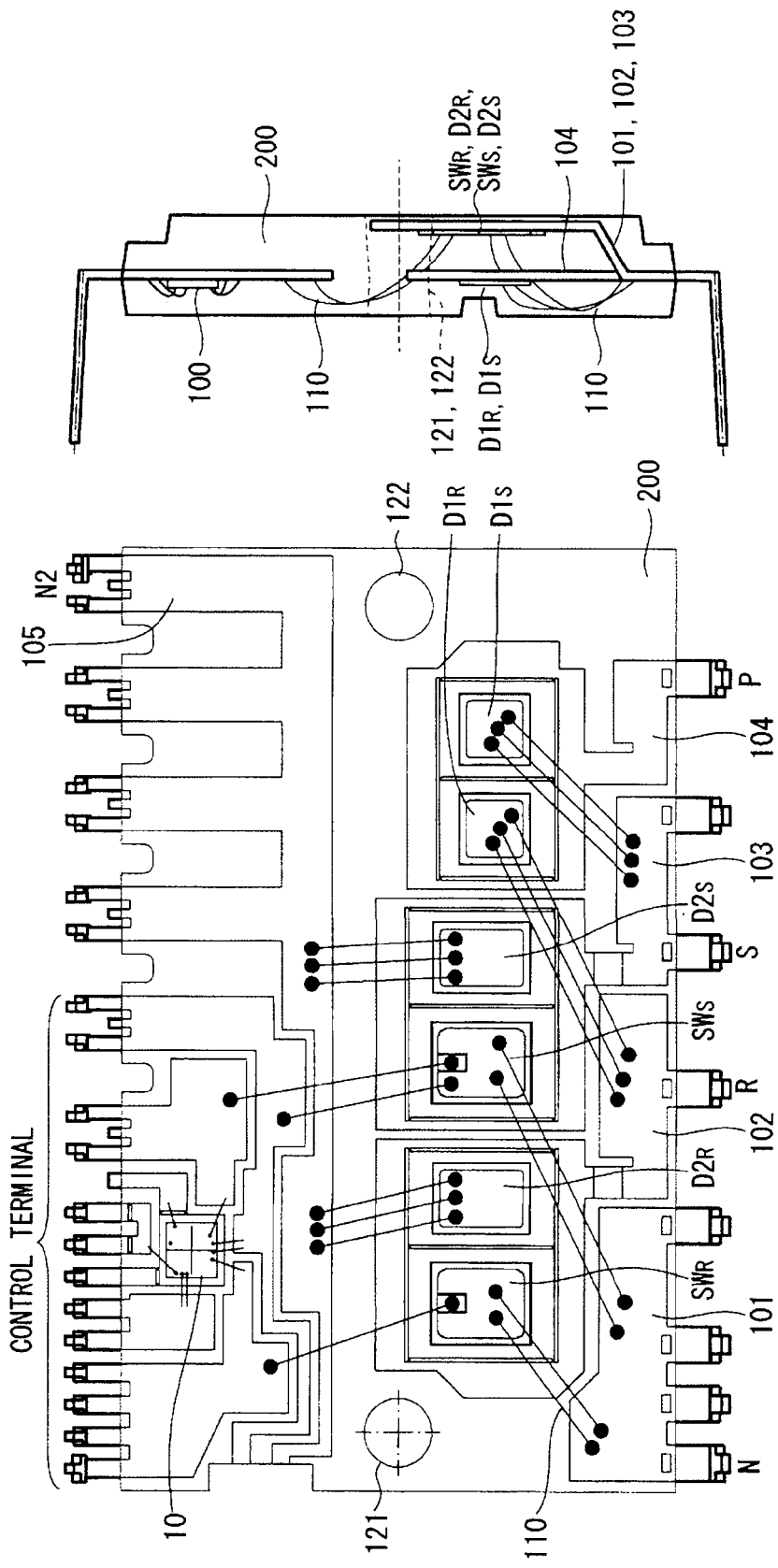
FIG. 3 shows the structure of a PFC module of a first preferred embodiment.

The structure of a PFC module of a first preferred embodiment of the present invention is described next by referring to FIG. 3. In FIG. 3, elements having the same functions as those of the corresponding elements of FIG. 2 are identified by the same reference numerals.

The first preferred embodiment includes first to fourth diodes $D1_R$, $D1_S$, $D2_R$ and $D2_S$, and first and second switching elements $SW_R$ and $SW_S$ that are provided as chips for power control (power chips). The first and second diodes $D1_R$ and $D1_S$ in the upper arm of a diode bridge are Schottky barrier diodes formed as SiC devices. Like in the conventional example, regarding the other chips, the third and fourth diodes $D2_R$ and $D2_S$ are Schottky barrier diodes formed as Si devices, and the first and second switching elements $SW_R$ and $SW_S$ are IGBTs for example formed as Si devices. As the third and fourth diodes $D2_R$ and $D2_S$, PiN diodes are used if a breakdown voltage is several hundred volts or higher and Schottky barrier diodes are used if a breakdown voltage is several hundred volts or lower.

The first and second diodes $D1_R$ and $D1_S$ in the upper arm of the diode bridge function not only as rectifying elements but also as free-wheeling diodes while the first and second switching elements $SW_R$ and $SW_S$ are in operation for PFC. To be specific, the first and second switching elements $SW_R$ and $SW_S$ operate at high frequencies during PFC control, so recovery loss generated during the free-wheeling operation of the first and second diodes $D1_R$ and $D1_S$ contributes largely to the loss of the entire PFC module. The first and second diodes $D1_R$ and $D1_S$ formed as SiC devices with low loss and excellent recovery characteristics allow significant reduction of the loss of the PFC module. Further, not all the power chips but only the first and second diodes $D1_R$ and $D1_S$ are formed as SiC devices, so that cost increase is suppressed.

As shown in the sectional view of FIG. 3, a lead frame 104 holding the first and second diodes $D1_R$ and $D1_S$ thereon is not bent downward (in a direction perpendicular to the surface of the lead frame 104 on which the first and second diodes $D1_R$ and $D1_S$ are placed) inside the casing 200. In this case, degradation of the heat dissipating characteristics of the first and second diodes $D1_R$ and $D1_S$ may be thought of. However, such degradation will not occur as the SiC devices have excellent resistance to heat. Generation of heat is also suppressed as the losses of the first and second diodes $D1_R$ and $D1_S$ are reduced compared to large losses thereof generated in the conventional example. This makes the insulating sheet 120 shown in FIG. 2 unnecessary, leading to cost reduction.

Second Preferred Embodiment

Figure 4:
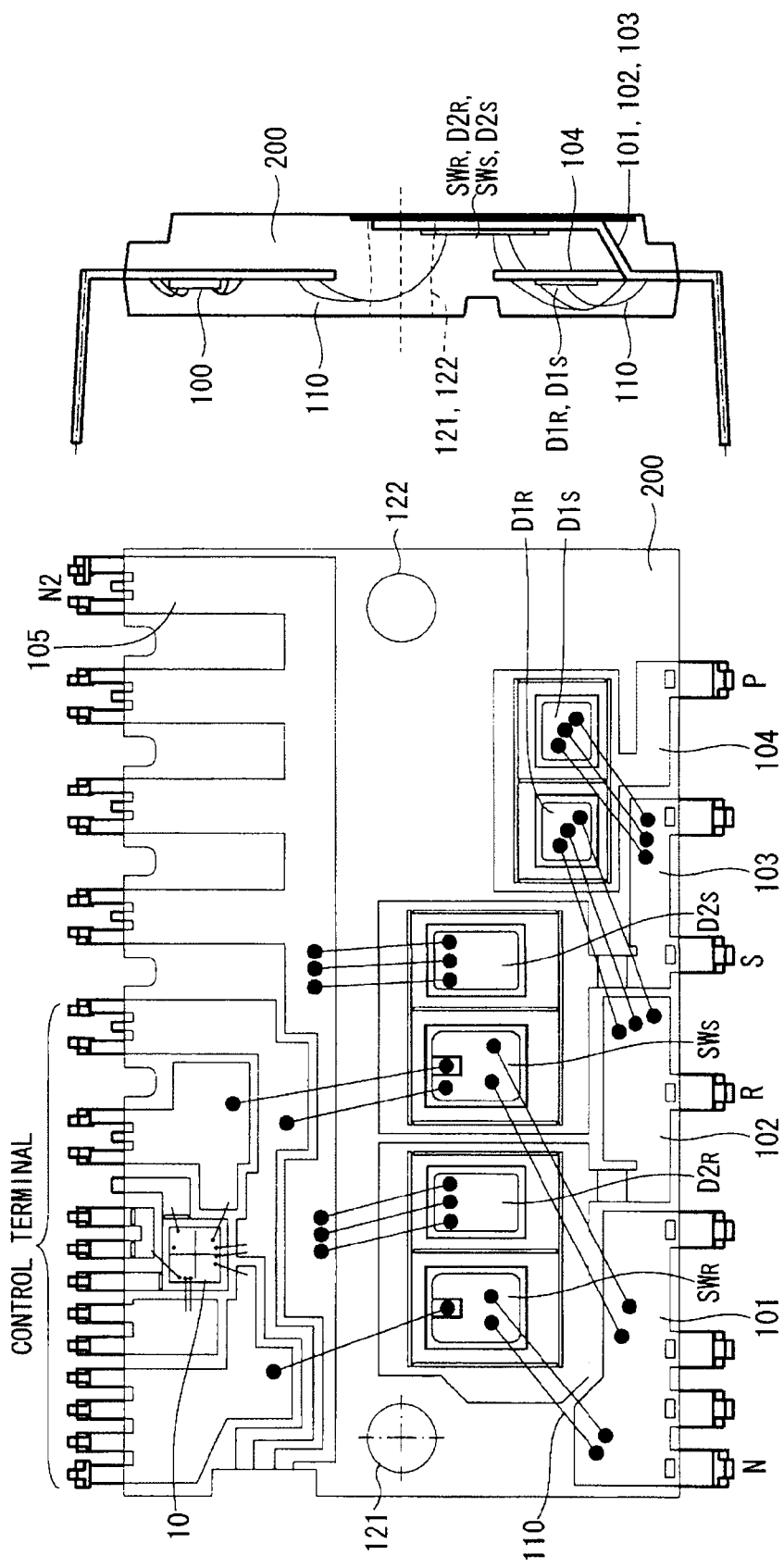
FIG. 4 shows the structure of a PFC module of a second preferred embodiment.

FIG. 4 shows the structure of a PFC module of a second preferred embodiment. In the second preferred embodiment, first and second diodes $D1_R$ and $D1_S$ formed as SiC devices are arranged on the outer side than third and fourth diodes $D2_R$ and $D2_S$, and first and second switching elements $SW_R$ and $SW_S$. More specifically, the first and second diodes $D1_R$ and $D1_S$ are placed near a side surface of a casing 200 from which lead frames 101 to 104 project. Like in the first preferred embodiment, a first lead frame holding the first and second diodes $D1_R$ and $D1_S$ thereon is not bent downward (in a direction perpendicular to the surface of the first lead frame on which the first and second diodes $D1_R$ and $D1_S$ are placed) inside the casing 200.

This structure can shorten wire lines 110 for connecting the first and second diodes $D1_R$ and $D1_S$, and the lead frames 102 and 103. The length of the wire lines 110 affects the durability of the PFC module to withstand a surge current. Shortening the wire lines 110 enhances the durability to withstand a surge current. If the PFC module has a rating of 600 V and 20 A (rms), for example, the length of the wire lines 110 for connecting the first and second diodes $D1_R$ and $D1_S$, and the lead frames 102 and 104 can be shortened to approximately half the length of the conventional example (shortened to 5 mm if the length of the conventional example is 10 mm).

Third Preferred Embodiment

Figure 5:
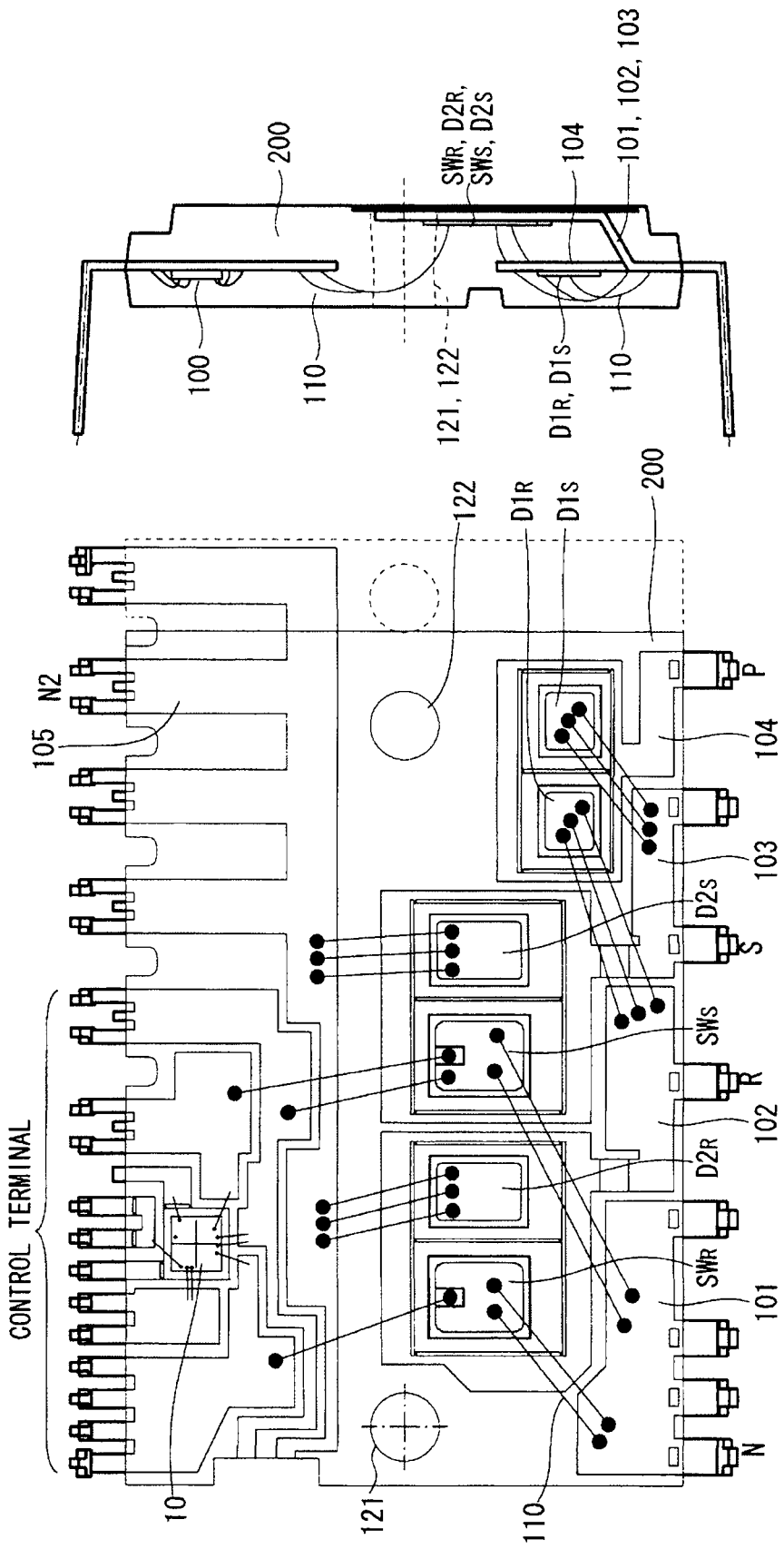
FIG. 5 shows the structure of a PFC module of a third preferred embodiment.

FIG. 5 shows the structure of a PFC module of a third preferred embodiment. Like in the second preferred embodiment, first and second diodes $D1_R$ and $D1_S$ formed as SiC devices are arranged on the outer side than third and fourth diodes $D2_R$ and $D2_S$, and first and second switching elements $SW_R$ and $SW_S$ (near a side surface of a casing 200 from which lead frames 101 to 104 project).

An SiC device allows size reduction of a chip as a result of its low resistance. As an example, a module having a rating of 600 V and 20 A (rms) can reduce the chip sizes of the first and second diodes $D1_R$ and $D1_S$ by about half. So, a central portion of the casing 200 becomes empty space if the first and second diodes $D1_R$ and $D1_S$ are placed on the outer side. In the third preferred embodiment, a through hole 122 is formed in this space. To be specific, at least one of the first and second diodes $D1_R$ and $D1_S$ is arranged between the through hole 122 and the aforementioned side surface of the casing 200 in plan view (in the plan view of FIG. 5, the through hole 122, and the first and second diodes $D1_R$ and $D1_S$ are aligned vertically).

The third preferred embodiment allows the through hole 122 to be placed on the inner side of the casing 200, thereby realizing reduction of the package size of the PFC module. If the module has a rating of 600 V and 20 A (rms), for example, the length of the package (length of the casing 200) can be shorter by about 4 mm than those of the first and second preferred embodiments (FIGS. 3 and 4). Dotted lines of FIG. 5 indicate the shapes of the casing 200 and the through hole 122 of the first and second preferred embodiments.

As described above, the present invention makes effective use of the characteristic features of an SiC device including high breakdown voltage, low loss, and high resistance to heat. These are not only the features of an SiC device, but also the features of semiconductor devices using other wide bandgap semiconductors. So, the aforementioned effects are also achieved if the first and second diodes $D1_R$ and $D1_S$ are Schottky barrier diode formed by using a wide bandgap semiconductor except SiC.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module, comprising:
   a diode bridge having first and second diodes with cathodes connected to each other, and third and fourth diodes with anodes connected to each other, the first and third diodes being connected in series, the second and fourth diodes being connected in series;
   a first switching element connected to a connection node between said first and third diodes; and
   a second switching element connected to a connection node between said second and fourth diodes,
   said first and second diodes being Schottky barrier diodes formed by using a wide bandgap semiconductor,
   said third and fourth diodes, and said first and second switching elements being diodes and switching elements respectively formed by using silicon.

2. The semiconductor module according to claim 1, further comprising:
   a first lead frame on which said first and second diodes are placed;
   a second lead frame on which said third diode and said first switching element are placed;
   a third lead frame on which said fourth diode and said second switching element are placed; and
   a molding resin for holding said first to fourth diodes, said first and second switching elements, and said first to third lead frames, the molding resin forming a casing of said semiconductor module, wherein
   said first to third lead frames project in part as external connection terminals from one side surface of said casing made of said molding resin, and
   said first and second diodes are placed nearer said side surface inside said casing than said third and fourth diodes and said first and second switching elements.

3. The semiconductor module according to claim 2, wherein said first lead frame is not bent inside said casing in a direction perpendicular to a surface of said first lead frame on which said first and second diodes are placed.

4. The semiconductor module according to claim 2, wherein
   said casing is provided with a through hole penetrating through said casing, and
   at least one of said first and second diodes is arranged between said through hole and said side surface of said casing in plan view.

5. The semiconductor module according to claim 1, further comprising a driver IC for driving said first and second switching elements.

* * * * *